(12) United States Patent
Lin

(10) Patent No.: US 10,424,353 B2
(45) Date of Patent: Sep. 24, 2019

(54) CURRENT-SENSING CIRCUIT FOR MEMORY AND SENSING METHOD THEREOF

(71) Applicant: Winbond Electronics Corp., Taichung (TW)

(72) Inventor: Hung-Hsueh Lin, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/008,042

(22) Filed: Jun. 14, 2018

(65) Prior Publication Data

US 2019/0013053 A1 Jan. 10, 2019

(30) Foreign Application Priority Data

Jul. 10, 2017 (CN) .......................... 2017 1 0555943

(51) Int. Cl.
*G11C 7/12* (2006.01)
*G11C 7/06* (2006.01)
(Continued)

(52) U.S. Cl.
CPC ................. *G11C 7/12* (2013.01); *G11C 7/06* (2013.01); *G11C 7/062* (2013.01); *G11C 16/24* (2013.01); *G11C 16/26* (2013.01); *G11C 16/28* (2013.01); *G11C 16/32* (2013.01); *G11C 2207/063* (2013.01)

(58) Field of Classification Search
CPC .. G11C 7/12; G11C 7/06; G11C 7/062; G11C 16/24; G11C 16/26; G11C 16/28; G11C 16/32
See application file for complete search history.

(56) References Cited

U.S. PATENT DOCUMENTS 7,881,119 B2 * 2/2011 Fukushima ............. G05F 3/262
365/185.21
8,743,630 B2 * 6/2014 Mueller ................. G11C 7/062
365/189.15
(Continued)

FOREIGN PATENT DOCUMENTS

CN 100440377 12/2008
TW I514411 12/2015

*Primary Examiner* — Tri M Hoang
(74) *Attorney, Agent, or Firm* — JCIPRNET

(57) ABSTRACT

A current-sensing circuit for a memory and a sensing method thereof are provided. The current-sensing circuit includes a pre-charge circuit, a sensing current-to-voltage generator, an auxiliary current-to-voltage generator, a reference current-to-voltage generator, and a detection circuit. The pre-charge circuit provides a pre-charge signal to a selected bit line during a pre-charge time period. The sensing current-to-voltage generator generates a sensing voltage to a memory cell current of the selected bit line via a first load. The auxiliary current-to-voltage generator provides a detection voltage to a portion of the memory cell current of the selected bit line via a second load. The reference current-to-voltage generator provides a reference voltage during a data-sensing time period. The detection circuit determines an end time point of the pre-charge time period by comparing a detected voltage generated by the second load with a reference voltage.

12 Claims, 3 Drawing Sheets

(51) Int. Cl.
  *G11C 16/26* (2006.01)
  *G11C 16/24* (2006.01)
  *G11C 16/28* (2006.01)
  *G11C 16/32* (2006.01)

(56) References Cited

U.S. PATENT DOCUMENTS

| | | |
|---|---|---|
| 8,908,426 B2 * | 12/2014 | Wang ................. G11C 11/5678 |
| | | 365/163 |
| 8,947,935 B2 | 2/2015 | Kim et al. |
| 2004/0004880 A1 | 1/2004 | Yoon et al. |
| 2012/0182818 A1 | 7/2012 | Huang et al. |
| 2014/0056089 A1 * | 2/2014 | Vimercati ........... H03F 3/45762 |
| | | 365/203 |
| 2015/0063020 A1 * | 3/2015 | Kajigaya ............ G11C 11/1675 |
| | | 365/158 |
| 2015/0255165 A1 * | 9/2015 | Tran .................... G11C 11/1673 |
| | | 365/185.11 |
| 2017/0103972 A1 | 4/2017 | Yamada et al. |

* cited by examiner

CURRENT-SENSING CIRCUIT FOR MEMORY AND SENSING METHOD THEREOF

CROSS-REFERENCE TO RELATED APPLICATION

This application claims the priority benefit of China application serial no. 201710555943.4, filed on Jul. 10, 2017. The entirety of the above-mentioned patent application is hereby incorporated by reference herein and made a part of this specification.

BACKGROUND OF THE INVENTION

Field of the Invention

The invention relates to a sensing circuit for a memory and a sensing method thereof, and more particularly, to a sensing circuit for a memory that can dynamically adjust pre-charge time length and a sensing method thereof.

Description of Related Art

In a flash memory, to accelerate data read-out speed, in particular in high-density and low-working voltage flash memory cell designs, known techniques often reduce the desired time length of the sensing time period via a pre-charge mechanism. However, the pre-charge mechanism adopted in known techniques is often performed via a fixed-length pre-charge time period or fixed-intensity pre-charge signal, and once overcharge phenomenon occurs, the reverse effect of increase in desired time length in the sensing time period occurs, such that the overall performance of the memory is reduced.

SUMMARY OF THE INVENTION

The invention provides a sensing circuit for a memory and a sensing method thereof that can effectively accelerate the sensing speed of read-out data.

The sensing circuit for a memory of the invention includes a pre-charge circuit, a sensing current-to-voltage generator and switch thereof, an auxiliary current-to-voltage generator and switch thereof, a reference current-to-voltage generator and switch thereof, and a detection circuit. The pre-charge circuit can be coupled to a selected bit line of a read memory cell via a current-to-voltage generator of the same type and provide a pre-charge signal to the selected bit line during a pre-charge time period. The sensing current-to-voltage generator switch is activated during the data-sensing time period, and the sensing current-to-voltage generator outputs a memory cell current coupled to the selected bit line and generates a sensing voltage via a first load. The auxiliary current-to-voltage generator switch is activated during the pre-charge time period, and the auxiliary current-to-voltage generator outputs a portion of the memory cell current coupled to the selected bit line and provides an auxiliary sensing voltage via a second load. The reference current-to-voltage generator switch is activated during the data-sensing time period, and the reference current-to-voltage generator outputs a reference memory cell current coupled to a reference bit line and generates a reference voltage via a reference load. The detection circuit is coupled to the second load and determines the end time point of the pre-charge time period by comparing a detected voltage generated by the second load and a reference voltage generated by the reference load.

The sensing method for a memory of the invention includes: enabling a pre-charge time period during a data-sensing time period; providing a pre-charge current to a selected bit line coupled to a read memory cell via a current-to-voltage generator during the pre-charge time period; coupling an auxiliary current-to-voltage generator to the selected bit line at the same time during the pre-charge time period and providing a detected voltage via a second load and a portion of a current of a read memory cell; and determining an end time point of the pre-charge time period by comparing the detected voltage generated by the second load with a reference voltage; enabling a sensing current-to-voltage generator switch during the data-sensing time period, wherein the sensing current-to-voltage generator outputs a memory cell current coupled to the selected bit line, and provides a sensing voltage via a first load and the read memory cell current.

Based on the above, the sensing circuit for a memory and a sensing method thereof provided in the invention can effectively accelerate the sensing speed of read-out data by providing a dynamically-adjusted pre-charge mechanism to increase the work efficiency of the memory.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this disclosure. The drawings illustrate embodiments of the disclosure and, together with the description, serve to explain the principles of the disclosure.

DESCRIPTION OF THE EMBODIMENTS

Figure 1:
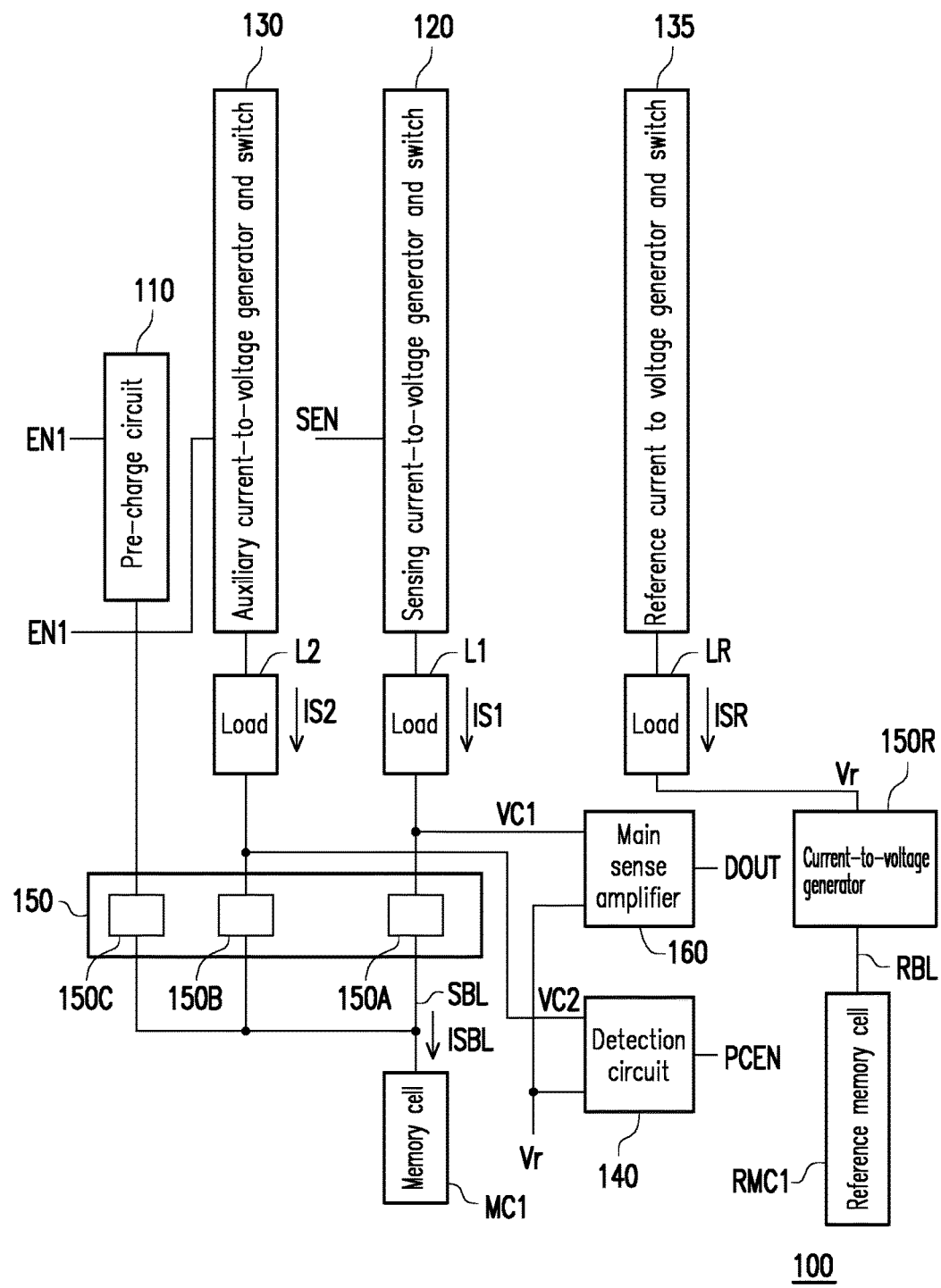
FIG. 1 shows a schematic of a sensing circuit for a memory of an embodiment of the invention.

Referring to FIG. 1, FIG. 1 shows a schematic of a sensing circuit for a memory of an embodiment of the invention. A sensing circuit 100 includes a pre-charge circuit 110, a sensing current-to-voltage generator and switch 120, an auxiliary current-to-voltage generator and switch 130, a reference current-to-voltage generator and switch 135, a detection circuit 140, a current-to-voltage generator set 150 (containing a sensing current-to-voltage generator 150A, an auxiliary current-to-voltage switch generator 150B, and a current-to-voltage generator 150C of a pre-charge path), a reference current-to-voltage generator 150R, and a main sense amplifier 160. The pre-charge circuit 110 is coupled to a selected bit line SBL of a read memory cell MC1 via a current-to-voltage generator 150C of the same type and provides a pre-charge current to the selected bit line SBL during the pre-charge time period according to a signal EN1. At this point, the signal EN1 is generated according to a pre-charge enabling signal PCEN. The sensing current-to-voltage generator and switch 120 is enabled according to a sense-enabling signal SEN and is coupled to the selected bit line SBL via the sensing current-to-voltage generator 150A during the data-sensing time period to provide a sensing current IS1 to the first load L1 to generate a sensing voltage VC1. The auxiliary current generator and switch 130 is coupled to the selected bit line SBL via the auxiliary current-to-voltage generator 150B during the pre-charge time period according to the signal EN1 to provide an auxiliary sensing current IS2 to the second load L2 to generate a detected voltage VC2. The detection circuit 140 is coupled to the detection load L2 and determines the end time point during the pre-charge time period by comparing the detected voltage VC2 generated by a portion of the current of the read memory cell of the detection load L2 and the selected bit line SBL with a reference voltage Vr. In particular, the detection circuit 140 generates a pre-charge disabling enabling signal PCEN by comparing the detected voltage VC2 and the reference voltage Vr. In particular, when the detected voltage VC2 is less than the reference voltage Vr, the detection circuit 140 can keep the pre-charge enabling signal PCEN enabled (first logic level) and make the pre-charge circuit 110 provide a pre-charge signal to perform a pre-charge operation on the selected bit line SBL. Moreover, when the detected voltage VC2 is increased to equal to or slightly less than the reference voltage Vr, the detection circuit 140 can disable the pre-charge enabling signal PCEN (second logic level complementary to the first logic level) and make the pre-charge circuit 110 stop providing the pre-charge signal so as to perform a pre-charge operation on the selected bit line SBL. The main sense amplifier 160 is coupled to the sensing load L1 to receive the voltage VC1 on the sensing load L1 and the reference voltage Vr and generate a read data DOUT by comparing the voltage VC1 and the reference voltage Vr in response to the sensing voltage VC1 generated by providing the sensing current IS1 to the sensing load L1 in the last stage.

The reference current-to-voltage generator switch 135 provides a reference current ISR of a reference memory cell RMC1 on a reference bit line RBL via the current-to-voltage generator set 150R during the data-sensing time period and generates a reference voltage Vr on the endpoint coupled to a reference load LR and the current-to-voltage generator set 150R. The current-to-voltage generator 150R provides a reference memory cell RMC1 current to the reference load LR to generate the reference voltage Vr.

The sensing current-to-voltage generator 150A, the auxiliary current-to-voltage generator 150B, and the current-to-voltage generator 150C in the current-to-voltage generator set 150 are respectively coupled between the path of the sensing load L1, the detection load L2, and the pre-charge circuit 110 and the selected bit line SBL to convert the current signal on the path into a voltage signal. Moreover, the use of the same type of current-to-voltage generator ensures the sensing current IS1 is equal to the auxiliary sensing current IS2 and the charging pre-charge current during the pre-charge time period, and the sum of the three currents comes from the read memory cell MC1 current.

In the overall operation details, in the initial stage of the data-sensing time period, the sensing circuit 100 enters the pre-charge time period and makes the pre-charge circuit 110 provide a pre-charge signal to the selected bit line SBL according to the signal EN1. At the same time, the auxiliary current-to-voltage generator 150B and the sensing current-to-voltage generator 150A respectively provide the auxiliary sensing current IS2 and the sensing current IS1 and make the auxiliary sensing current IS2 and the sensing current IS1 respectively pass through the detection load L2 and the sensing load L1, wherein the sensing current IS1, the auxiliary sensing current IS2, and the pre-charge current are a current ISBL of the read memory cell MC1 reaching the selected bit line.

Via the current-to-voltage generator 150B, the detection circuit 140 receives the reference voltage Vr and the detected voltage VC2 on the detection load L2. The detection circuit 140 generates the pre-charge enabling signal PCEN by comparing the voltage difference of the detected voltage VC2 and the reference voltage Vr, wherein at the beginning of the data-sensing time period, the detection circuit 140 can generate an enabled pre-charge enabling signal PCEN, and when the voltage value of the detected voltage VC2 is increased to equal to or slightly less than the voltage value of the reference voltage Vr, the detection voltage 140 can generate a disabled pre-charge enabling signal PCEN. In particular, when the pre-charge enabling signal PCEN is enabled, the pre-charge circuit 110 begins and keeps providing a pre-charge current, and when the pre-charge enabling signal PCEN is disabled, the pre-charge circuit 110 stops providing the pre-charge current and stops the pre-charge time period.

It should be noted here that, in the present embodiment, the impedance value of the detection load L2 is equal to the reference load LR multiplied by a ratio, and the ratio is determined by the ratio of the auxiliary sensing current IS2 and the read memory cell MC1 current. In other words, the auxiliary sensing current IS2 is equivalent to the sensing current IS1 and the pre-charge current via current-to-voltage generators having the same hardware structure, and all three are one-third of the read memory cell MC1 current ISBL during the pre-charge time period, and therefore the impedance value of the detection load L2 is about 3 times or slightly less than 3 times of the impedance value of the reference load LR. Accordingly, the sensing circuit 100 can stop the pre-charge operation performed by the pre-charge circuit 110 when the voltage value on the selected bit line SBL is pre-charged to about equal to the voltage value of the reference voltage Vr to effectively prevent the phenomenon of pre-charge overcharge from occurring.

It should be mentioned that, according to the pre-set ratio relationship between the impedance value of the detection load L2 and the reference load LR, the voltage value of the detected voltage VC2 can be equal to or slightly less than the voltage value of the reference voltage Vr on the same time point. As a result, the pre-charge operation can be ended sooner to ensure the occurrence of the phenomenon of pre-charge overcharge.

Figure 2A:
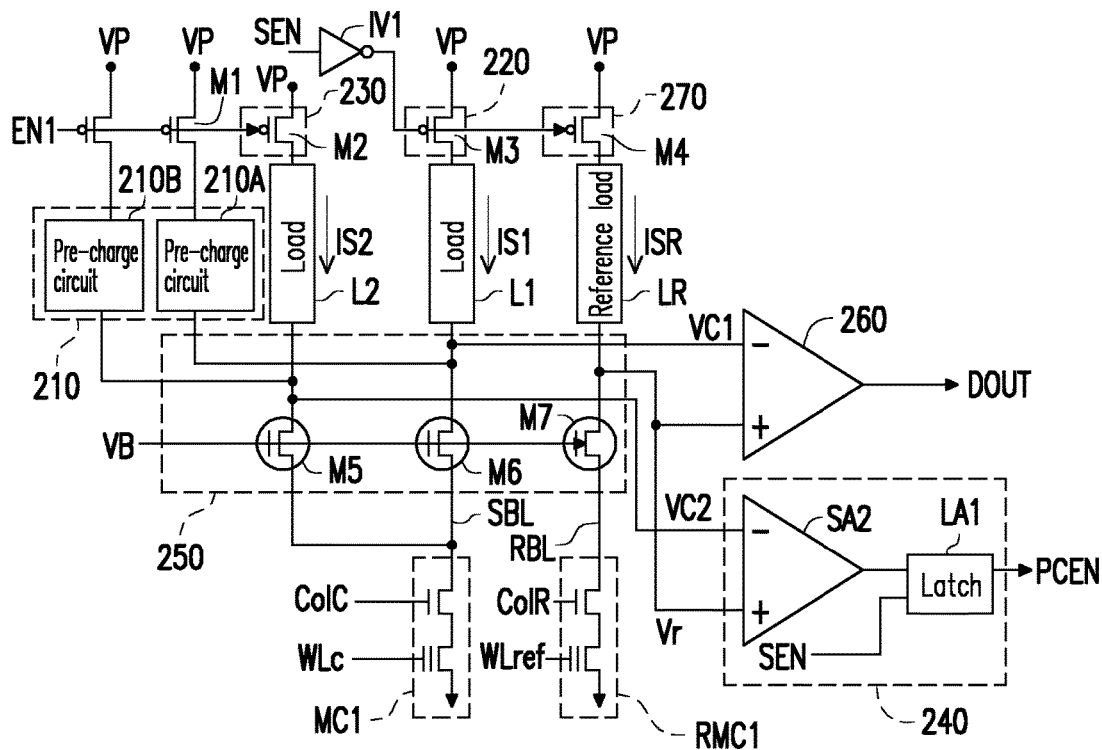
FIG. 2A shows a schematic of a sensing circuit of another embodiment of the invention.

Referring to FIG. 2A in the following, FIG. 2A shows a schematic of a sensing circuit of another embodiment of the invention. The sensing circuit 200 includes a pre-charge circuit 210, a sensing current-to-voltage generator switch 220, an auxiliary current-to-voltage generator switch 230, a detection circuit 240, a current-to-voltage generator set 250, a main sense amplifier 260, and a reference current-to-voltage generator switch 270.

In the present embodiment, the pre-charge circuit 210 is coupled to a power supply terminal VP via a switch formed by a transistor M1. In particular, the transistor M1 is controlled by the signal EN1 to turn on or off and control the on and off of the pre-charge circuit 210. The pre-charge circuit 210 can be a current source and provide a pre-charge current of the current signal to the selected bit line SBL via the current-to-voltage generator set 250 when the transistor M1 is turned on. Moreover, the sensing current-to-voltage generator and switch 220, the auxiliary current-to-voltage generator and switch 230, and the reference current-to-voltage generator and switch 270 are respectively formed by transistors M3, M2, and M4. In particular, the transistor M2 is controlled by the signal EN1 to provide the auxiliary sensing current IS2 via the current-to-voltage generator set 250. The transistors M3 and M4 are controlled by a reverse signal of the sense-enabling signal SEN to respectively provide the sensing current IS1 and the reference current ISR to the sensing load L1 and the detection load L2 via the current-to-voltage generator set 250 to generate the sensing voltage VC1 and the detected voltage VC2. In particular, a reverse device IV1 receives the sense-enabling signal SEN and generates the reverse signal of the sense-enabling signal SEN.

Moreover, the reference current-to-voltage generator and switch 270 of the present embodiment is enabled during the data-sensing time period, and the reference current-to-voltage generator and switch 270 provides the reference memory cell RMC1 current ISR to the reference load LR via the current-to-voltage generator set 250 to generate the reference voltage Vr. In particular, the main sense amplifier 260 receives the reference voltage Vr and the sensing voltage VC1 and generates a detection result after the pre-charge time period ends via the voltage difference of the reference voltage Vr and the sensing voltage VC1.

In the present embodiment, the detection circuit 240 includes an auxiliary sense amplifier SA2 and a latch LA1. The auxiliary sense amplifier SA2 receives the reference voltage Vr and the detected voltage VC2 and generates a detection result by sensing the voltage difference of the reference voltage Vr and the detected voltage VC2. The latch LA1 is coupled to the output terminal of the auxiliary sense amplifier SA2 and generates the pre-charge enabling signal PCEN according to the detection result of the auxiliary sense amplifier SA2.

In terms of operation details, the latch LA1 receives the detection result of the auxiliary sense amplifier SA2 and receives the sense-enabling signal SEN. At the initial time point when the sensing time period is enabled, the latch LA1 can enable the pre-charge enabling signal PCEN according to the transitioned sense-enabling signal SEN and enable the pre-charge time period. Moreover, when the detection result of the auxiliary sense amplifier SA2 indicates the voltage value of the detected voltage VC2 is not less than the voltage value of the reference voltage Vr, the latch LA1 can disable the pre-charge enabling signal PCEN according to the detection result of the auxiliary sense amplifier SA2 and stop the pre-charge time period. In an embodiment of the invention, the latch LA1 can be an ST latch, and the hardware structure of the auxiliary sense amplifier SA2 can be the same as the hardware structure of the main sense amplifier 260.

In the present embodiment, the current-to-voltage generator set 250 includes a plurality of transistors M5 to M7. The transistor M5 is connected between the detection load L2 and the selected bit line SBL in series; the transistor M6 is connected between the sensing load L1 and the selected bit line SBL in series; and the transistor M7 is connected between the reference load LR and the reference bit line RBL in series. The transistors M5 to M7 are all controlled by a bias voltage VB to perform a current-to-voltage conversion operation. Each set of current-to-voltage generators has the same hardware structure, i.e., the transistors M5 to M7 have the same shape and size. In particular, the current-to-voltage generator controlled by a bias voltage transistor is only an example, and current-to-voltage generators having other circuit structures can also achieve the operation of the pre-charge circuit sensing circuit. It should be mentioned that, the pre-charge circuit 210 in the present embodiment can respectively be connected to the junction of the sensing load L1 and the transistor M6 and the junction of the detection load L2 and the transistor M5 in two equivalents (pre-charge circuit set pair formed by pre-charge circuits 210A and 210B) and allow the pre-charge current to evenly pass through the transistors M6 and M5 and be provided to the selected bit line SBL, such that the sensing current IS1 and the auxiliary sensing current IS2 are consistently maintained during the pre-charge time period and the ratio of the auxiliary sensing current IS2 and the read memory cell MC1 current is confirmed.

Moreover, the selected memory cell MC1 and the reference memory cell RMC1 in the present embodiment can have the same hardware structures, wherein the selected memory cell MC1 is controlled by a column address control signal ColC and a bit line address signal WLC, and the reference memory cell RMC1 is controlled by a reference column control signal ColR and a reference bit line signal WLref. The selected memory cell MC1 and the reference memory cell RMC1 can both be flash memory cells.

Figure 2B:
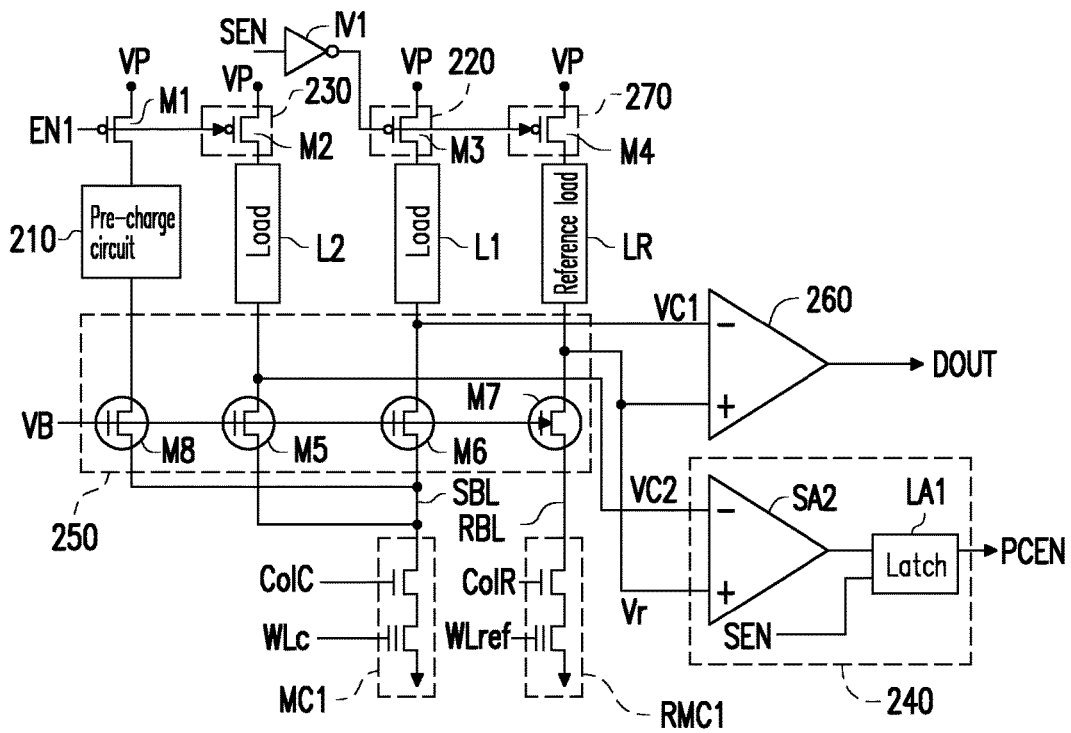
FIG. 2B shows a schematic of another embodiment of the sensing circuit of the embodiment of FIG. 2A of the invention.

Referring to FIG. 2B below, FIG. 2B shows a schematic of another embodiment of the sensing circuit of the embodiment of FIG. 2A of the invention. The difference from the embodiment shown in FIG. 2A is that, in FIG. 2B, the pre-charge circuit 210 is coupled to the selected bit line SBL via an independent transistor M8 and sends a pre-charge current to the selected bit line SBL via the transistor M8. In particular, the transistor M8 similarly is controlled by the bias voltage VB and is used to execute a current-to-voltage conversion operation such that the charging current is substantially the same as a current passing through other current-to-voltage converters.

Figure 3:
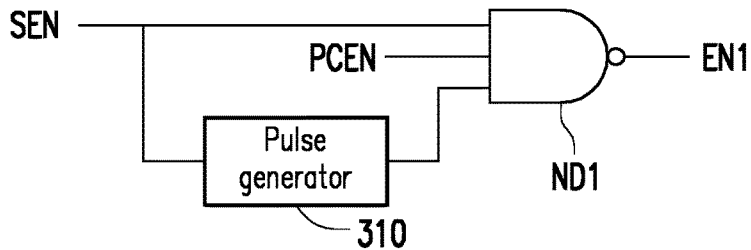
FIG. 3 shows a schematic of a generation method of a signal EN1 of an embodiment of the invention.

Referring to FIG. 3, FIG. 3 shows a schematic of a generation method of the EN1 signal of an embodiment of the invention. The signal EN1 can be generated by a logic operation circuit ND1 and a pulse generator 310. In particular, the pulse generator 310 receives the sense-enabling signal SEN and generates a fixed-interval pulse signal according to the sense-enabling signal SEN during the data-sensing time period. The logic operation circuit ND1 receives the pulse signal generated by the pulse generator 310, the sense-enabling signal SEN, and the pre-charge enabling signal PCEN, and performs a NAND logic operation for the pulse signal generated by the pulse generator 310, the sense-enabling signal SEN, and the pre-charge enabling signal PCEN to generate the signal EN1. In particular, the signal EN1 is used to enable the pre-charge operation of the sensing circuit of an embodiment of the invention.

It should be noted here that, the NAND logic operation performed via the logic operation circuit ND1 is only one example and is not intended to limit the scope of the invention. In actuality, logic operation circuits having other operation forms can also be applied in an embodiment of the invention to generate the signal EN1, and the invention is not particularly limited in this regard. For instance, when the signal EN1 is at a logic high level and the pre-charge operation of the sensing circuit can be enabled, a logic operation circuit executing an AND logic operation can be applied to generate the signal EN1. Alternatively, when the pulse signal generated by the pulse generator 310 and the enabled logic levels of the sense-enabling signal SEN and the pre-charge enabling signal PCEN are changed, a logic operation circuit executing other types of logic operations can be applied to generate the signal EN1.

Figure 4:
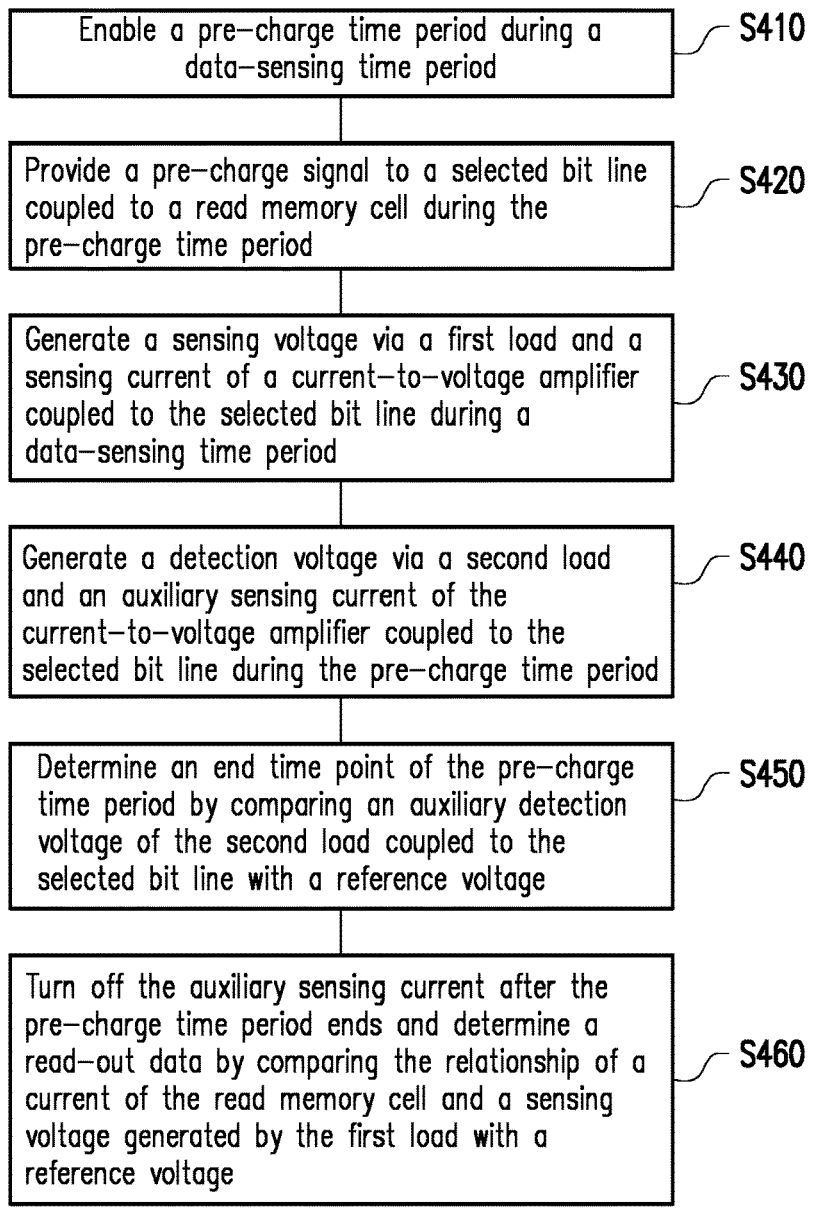
FIG. 4 shows a flowchart of a sensing method of a memory of an embodiment of the invention.

In the following, referring to FIG. 4, FIG. 4 shows a flowchart of a sensing method for a memory of an embodiment of the invention. In step S410, a pre-charge time period is enabled during a data-sensing time period, and the initial time point when the pre-charge time period is enabled during the data-sensing time period is enabled. Next, in step S420, a pre-charge current is provided to a selected bit line coupled to a read memory cell during the pre-charge time period, and in steps S430 and S440, a sensing current is provided to a first load by coupling a current-to-voltage converter to the selected bit line respectively during the data-sensing time period, and at the same time, a reference current is provided to a reference load by coupling the same type of a current-to-voltage converter to a reference bit line, and an auxiliary sensing current is provided to a second load by coupling the same type of a current-to-voltage converter to the selected bit line at the same time during the pre-charge time period. In step S450, the end time point of the pre-charge time period is determined by comparing a detected voltage on the coupling point of the second load and the selected bit line with a reference voltage. Lastly, in step S460, after the pre-charge time period ends, the auxiliary sensing current is turned off at the same time. A read-out data is generated by comparing the relationship of the current of the read memory cell to a sensing voltage generated by the first load and the reference voltage. At this point, the entire read memory cell current generates a read-out data via the voltage difference of the sensing voltage provided by the first load and the reference voltage.

Based on the above, during the pre-charge time period of the invention, the auxiliary current of a selected bit line and a detection load are coupled via a current-to-voltage generator at the same time to provide an auxiliary sensing voltage, i.e., a detected voltage, and whether a pre-charge operation is stopped is determined by the difference of the detected voltage on the detection load and a reference voltage. As a result, when the selected bit line is pre-charged to a voltage level equal to (or slightly less than) the reference voltage, the pre-charge operation can be stopped. The over-charge phenomenon of the pre-charge can be prevented and the read rate of the memory can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A sensing circuit for a memory, comprising:
a pre-charge circuit coupled to a selected bit line of a read memory cell via a current-to-voltage generator and providing a pre-charge current to the selected bit line during a pre-charge time period;
a sensing current-to-voltage generator and switch coupled to the selected bit line during a data-sensing time period to provide a sensing current to generate a sensing voltage via a first load;
a reference current-to-voltage generator and switch coupled to a reference memory cell during the data-sensing time period to provide a reference current to generate a reference voltage via a reference load;
an auxiliary current-to-voltage generator and switch coupled to the selected bit line during the pre-charge time period to provide an auxiliary sensing current to generate a detected voltage via a second load; and
a detection circuit coupled to the second load and determining an end time point of the pre-charge time period by comparing the detected voltage on a coupling point of the second load and the selected bit line with the reference voltage.

2. The sensing circuit of claim 1, wherein an impedance value of the second load is a ratio of an impedance value of the reference load, and the ratio is determined by a ratio of the auxiliary sensing current and a read memory cell current during the pre-charge time period.

3. The sensing circuit of claim 1, wherein the sensing circuit enables a pre-charge enabling signal when the data-sensing time period is activated, and disables the pre-charge enabling signal when the detected voltage is not less than the reference voltage, wherein the pre-charge enabling signal is used to indicate whether the pre-charge time period is enabled.

4. The sensing circuit of claim 1, wherein the sensing current-to-voltage generator and switch comprises:
a first transistor turning on the sensing current-to-voltage generator to the selected bit line according to a sense-enabling signal to provide the sensing current to the first load;
the reference current-to-voltage generator and switch comprises:
a second transistor turning on the reference current-to-voltage generator to the reference memory cell according to the sense-enabling signal to provide the reference current to the reference load;
the auxiliary current-to-voltage generator and switch comprises:
a third transistor turning on the auxiliary current-to-voltage generator to the selected bit line according to a pre-charge enabling signal to provide the auxiliary sensing current to the second load.

5. The sensing circuit of claim 1, further comprising:
a main sense amplifier coupled to the first load and receiving the sensing voltage, and coupled to the reference load and receiving the reference voltage,
wherein when the main sense amplifier is in the sensing time period and after the pre-charge time ends, the sensing current coupled on the selected bit line via the sensing current-to-voltage generator and a voltage difference of the sensing voltage generated by the first load and the reference voltage are compared to generate a read-out data.

6. The sensing circuit of claim 1, wherein the detection circuit comprises:
an auxiliary sense amplifier coupled to the second load and receiving the detected voltage, and coupled to the reference load and receiving the reference voltage and generating a detection result by comparing the detected voltage with the reference voltage; and
a latch coupled to the auxiliary sense amplifier and receiving and latching the detection result to generate a pre-charge enabling signal,
wherein the pre-charge enabling signal is used to indicate whether the pre-charge time period is activated.

7. The sensing circuit of claim 4, further comprising:
a current-to-voltage generator set having a plurality of current-to-voltage generators respectively coupled between the read memory cell and the first load and the second load, and coupled between the reference memory cell and the reference load to perform a current-to-voltage conversion operation according to a bias voltage.

8. The sensing circuit of claim 7, wherein each of the current-to-voltage generators comprises:
a transistor connected between a corresponding memory cell and a corresponding load in series and controlled by the bias voltage.

9. The sensing circuit of claim 1, wherein the pre-charge circuit comprises:
a pre-charge circuit set pair respectively coupled between the read memory cell and the sensing current-to-voltage generator and coupled between the read memory cell and the auxiliary current-to-voltage generator to provide the selected bit line to the pre-charge current during the pre-charge time period.

10. A sensing method for a memory, comprising:
enabling a pre-charge time period during a data-sensing time period;
providing a pre-charge signal to a selected bit line coupled to a read memory cell during the pre-charge time period;
providing a sensing current-to-voltage generator and switch to be coupled to the selected bit line during the data-sensing time period to provide a sensing current to provide a sensing voltage via a first load;
providing an auxiliary current-to-voltage generator and switch during the pre-charge time period and coupling the auxiliary current-to-voltage generator to the selected bit line at the same time and providing an auxiliary sensing current to provide a detected voltage via a second load; and
determining an end time point during the pre-charge time period by comparing the detected voltage on the second load with a reference voltage.

11. The sensing method of claim 10, wherein a ratio of an impedance value of the first load and an impedance value of the reference load is determined by a ratio of the auxiliary sensing current and a read memory cell current.

12. The sensing method of claim 10, wherein the step of determining the end time point during the pre-charge time period by comparing the detected voltage on the coupling point of the second load and the auxiliary current-to-voltage generator with the reference voltage comprises:
enabling a pre-charge enabling signal when the data-sensing time period is enabled;
disabling the pre-charge enabling signal when the detected voltage is not less than the reference voltage,
wherein the pre-charge enabling signal is used to indicate whether the pre-charge time period is activated.

* * * * *